US012392486B2

(12) United States Patent
Price et al.

(10) Patent No.: US 12,392,486 B2
(45) Date of Patent: Aug. 19, 2025

(54) OPTIMISING OPERATING CONDITIONS IN AN ABATEMENT APPARATUS

(71) Applicant: Edwards Limited, Burgess Hill (GB)

(72) Inventors: Duncan Michael Price, Clevedon (GB); Michael Colin Graham, Clevedon (GB)

(73) Assignee: Edwards Limited, Burgess Hill (GB)

( * ) Notice: Subject to any disclaimer, the term of this patent is extended or adjusted under 35 U.S.C. 154(b) by 588 days.

(21) Appl. No.: 17/773,745

(22) PCT Filed: Nov. 3, 2020

(86) PCT No.: PCT/GB2020/052779
§ 371 (c)(1),
(2) Date: May 2, 2022

(87) PCT Pub. No.: WO2021/089993
PCT Pub. Date: May 14, 2021

(65) Prior Publication Data
US 2022/0373175 A1    Nov. 24, 2022

(30) Foreign Application Priority Data
Nov. 5, 2019 (GB) .................................... 1916069

(51) Int. Cl.
*F23G 7/06* (2006.01)
*C23C 16/44* (2006.01)

(52) U.S. Cl.
CPC .......... *F23G 7/065* (2013.01); *C23C 16/4412* (2013.01); *F23G 2204/103* (2013.01);
(Continued)

(58) Field of Classification Search
CPC ............... F23G 7/065; F23G 2207/104; F23G 2207/30; F23G 2900/55003; F23G 2900/55001
(Continued)

(56) References Cited

U.S. PATENT DOCUMENTS 5,750,076 A    5/1998 Buswell et al.
5,938,422 A    8/1999 Smith et al.
(Continued)

FOREIGN PATENT DOCUMENTS

JP    2007162959       6/2007
JP    2011176925 A     9/2011
(Continued)

OTHER PUBLICATIONS

British Examination Report dated Feb. 12, 2020 and Search Report dated Feb. 11, 2020 for corresponding British Application No. GB1916069.6, 7 pages.
(Continued)

*Primary Examiner* — Allen R. B. Schult
*Assistant Examiner* — William C Weinert
(74) *Attorney, Agent, or Firm* — Theodore M. Magee; Westman, Champlin & Koehler, P.A.

(57) ABSTRACT

A method of optimising operating conditions in an abatement apparatus configured to treat an effluent stream from a processing tool and an abatement apparatus are disclosed. The method of optimising operating conditions in an abatement apparatus configured to treat an effluent stream from a processing tool comprises: determining a concentration of carbon monoxide produced by the abatement apparatus when treating the effluent stream; and adjusting an operating parameter of the abatement apparatus in response to the concentration of carbon monoxide. In this way, the performance of the abatement device can be controlled by simply (Continued)

adjusting the operating parameters of the abatement device in response to the amount of carbon monoxide being produced to create conditions within the abatement apparatus which improve the removal of compounds being treated within the abatement device, while reducing undesirable by-products and without requiring advanced knowledge of the content of the effluent stream.

4 Claims, 10 Drawing Sheets

(52) U.S. Cl.
CPC .... *F23G 2207/104* (2013.01); *F23G 2207/30* (2013.01); *F23G 2209/142* (2013.01); *F23G 2900/55003* (2013.01)

(58) Field of Classification Search
USPC .............................................................. 431/5
See application file for complete search history.

(56) References Cited

U.S. PATENT DOCUMENTS

| | | | | |
|---|---|---|---|---|
| 7,494,633 | B2 * | 2/2009 | Stanton | B01D 53/68 422/111 |
| 8,647,111 | B2 | 2/2014 | Mennie et al. | |
| 8,668,868 | B2 * | 3/2014 | Chiu | B01D 53/38 210/600 |
| 2002/0033125 | A1 | 3/2002 | Cochran et al. | |
| 2006/0104878 | A1 | 5/2006 | Chiu et al. | |
| 2007/0172399 | A1 | 7/2007 | Clark et al. | |
| 2008/0014111 | A1 * | 1/2008 | Hedman | A61L 2/22 422/1 |
| 2009/0018688 | A1 | 1/2009 | Chandler et al. | |
| 2011/0039216 | A1 | 2/2011 | Geiger | |
| 2014/0322657 | A1 | 10/2014 | Katefidis | |

FOREIGN PATENT DOCUMENTS

| | | |
|---|---|---|
| JP | 2014126342 A | 7/2014 |
| TW | I356892 B | 1/2012 |
| WO | 2019016029 A1 | 1/2019 |

OTHER PUBLICATIONS

PCT Notification of Transmittal of the International Search Report and the Written Opinion of the International Searching Authority, or the Declaration dated Jan. 26, 2021 and PCT International Search Report dated Jan. 26, 2021 for corresponding PCT application Serial No. PCT/GB2020/052779, 6 pages.

PCT Written Opinion of the International Searching Authority, or the Declaration dated Jan. 26, 2021 for corresponding PCT application Serial No. PCT/GB2020/052779, 5 pages.

Taiwanese Office Action dated Mar. 1, 2024 and Search Report dated Feb. 27, 2024 for corresponding Taiwanese Application No. TW109138605, 10 pages.

Japanese Notification of Reason for Rejection dated Sep. 12, 2024 for corresponding Japanese application Serial No. 2022-525689, 6 pages.

* cited by examiner

OPTIMISING OPERATING CONDITIONS IN AN ABATEMENT APPARATUS

CROSS-REFERENCE TO RELATED APPLICATION

This application is a Section 371 National Stage Application of International Application No. PCT/GB2020/052779, filed Nov. 3, 2020, and published as WO 2021/089993 A1 on May 14, 2021, the content of which is hereby incorporated by reference in its entirety and which claims priority of British Application No. 1916069.6, filed Nov. 5, 2019.

FIELD

The field of the invention relates to a method of optimising operating conditions in an abatement apparatus configured to treat an effluent stream from a processing tool and an abatement apparatus.

BACKGROUND

Abatement apparatus are known and are typically used for treating an effluent gas stream from a manufacturing process tool used in, for example, the semiconductor or flat panel display manufacturing industry. During such manufacturing, residual hazardous and/or global warming gases remain in the effluent gas stream pumped from the process tool. These should be removed from the effluent gas before it is released into the atmosphere due to their nature and may also be undesirable because they are known to have adverse effects on the environment.

Known abatement apparatus such as radiant burners use combustion to remove the undesirable compounds from the effluent gas stream to meet a target concentration in the exhaust stream from the abatement apparatus. Typically, the effluent gas stream is a nitrogen stream containing residual gases such as hydrogen, ammonia, tetraethoxysilane (TEOS) and/or nitrous oxide and other compounds dependent on the processing step taking place in the process tool. A fuel gas and/or oxidant gas is mixed with the effluent gas stream and that gas stream mixture is conveyed into a combustion chamber that is laterally surrounded by the exit surface of a foraminous gas burner. Fuel gas and air are simultaneously supplied to the foraminous burner to affect flameless combustion at the exit surface, with the amount of air passing through the foraminous burner being enough to consume not only the fuel gas supplied to the burner, but also contribute towards the destruction of combustibles in the gas stream mixture injected into the combustion chamber.

Hydrogen, ammonia and TEOS are oxidizable gases and are typically at significant concentrations in the effluent gas stream but require additional oxidant (such as air or oxygen) to be added to the effluent stream in order to achieve the required level of abatement. U.S. Pat. No. 8,647,111 discloses that ammonia/hydrogen mixtures may be combusted by adding an appropriate amount of air. U.S. Pat. No. 5,938,422 discloses that TEOS can be destroyed by mixing it with oxygen prior to combustion within a combustion zone.

Nitrous oxide is an oxidising gas and it is desirable that it is ultimately reduced to nitrogen by adding a fuel gas at the point it is injected into the combustion chamber. Incomplete reduction of nitrous oxide leads to the formation of nitric oxide and nitrogen dioxide (collectively known as NOx) which are unwanted by-products since they contribute to acid rain and other environmental problems.

Although techniques exist for processing the effluent gas stream, they each have their own shortcomings. Accordingly, it is desired to provide an improved technique for processing an effluent gas stream.

The discussion above is merely provided for general background information and is not intended to be used as an aid in determining the scope of the claimed subject matter. The claimed subject matter is not limited to implementations that solve any or all disadvantages noted in the background.

SUMMARY

According to a first aspect, there is provided a method of optimising operating conditions in an abatement apparatus configured to treat an effluent stream from a processing tool, the method comprising: determining a concentration of carbon monoxide produced by the abatement apparatus when treating the effluent stream; and adjusting an operating parameter of the abatement apparatus in response to the concentration of carbon monoxide.

The first aspect recognizes that a problem with existing approaches to treating effluent streams is that it can be difficult to set the operating conditions of the abatement apparatus to treat the effluent stream effectively. Also, some operating conditions which might be suited to treating the effluent stream may lead to the production of undesirable by-products. Furthermore, existing approaches can be complex and/or require advance knowledge of the composition of the effluent stream being treated. However, the first aspect recognises that is possible to optimize the operating conditions for the removal of gases within an effluent stream being treated and reduce undesirable by-products by monitoring the carbon dioxide present when treating the effluent stream. Accordingly, a method is provided. The method may be for optimizing or adjusting the operation of an abatement apparatus which treats an effluent stream from a processing tool. The method may comprise determining or identifying a concentration of carbon monoxide produced or present when the abatement apparatus treats the effluent stream. The method may comprise adjusting or changing an operating parameter or the operation of the abatement apparatus in response to the carbon monoxide produced or present. Adjusting the operating parameter adjusts the operation of the of the abatement apparatus. In this way, the performance or operation of the abatement device can be controlled by simply adjusting the operating parameters of the abatement device in response to the amount of carbon monoxide being produced to create conditions within the abatement apparatus which improve the removal of compounds being treated within the abatement device compared with the conditions prior to the adjustments being made, while reducing undesirable by-products and without requiring advanced knowledge of the content of the effluent stream.

In one embodiment, the determining comprises measuring the concentration of carbon monoxide present in an exhaust of the abatement apparatus. Accordingly, the amount of carbon monoxide present in the exhaust of the abatement device which contains the treated effluent stream may be measured.

In one embodiment, the determining comprises measuring the concentration of carbon monoxide with an infrared spectrometer. Accordingly, carbon monoxide may be measured by infrared spectrometry which is less prone to contamination or deterioration and highly specific to the target analyte. Infrared sensors are highly responsive and recover quickly if saturated with analyte.

In one embodiment, the operating parameter comprises a fuel/oxidant ratio. Accordingly, the amount of fuel to oxidant supplied to the abatement apparatus may be adjusted in response to the concentration of carbon monoxide.

In one embodiment, the adjusting comprises changing the fuel/oxidant ratio to decrease the concentration of carbon monoxide. Accordingly, the amount of fuel to oxidant may be changed in order to decrease the amount of carbon monoxide.

In one embodiment, the adjusting comprises determining whether changing the fuel/oxidant ratio decreases the concentration of carbon monoxide and, if so, retaining that change. Accordingly, should a change to the amount of fuel to oxidant cause the amount of carbon monoxide to decrease, then that change in the amount of fuel to oxidant is kept.

In one embodiment, the adjusting comprises determining whether changing the fuel/oxidant ratio increases the concentration of carbon monoxide and, if so, reversing that change. Accordingly, should the change in the amount of fuel to oxidant cause the amount of carbon monoxide to be increased, then the change that was made to the amount of fuel to oxidant is discarded.

In one embodiment, the adjusting comprises varying a supply of the oxidant. Accordingly, the fuel to air ratio may be changed by changing the amount of the oxidant which is supplied to the abatement apparatus. This may allow the amount of fuel supply to be kept constant and so allow the adjustment to be made by varying just one component.

In one embodiment, the adjusting comprises increasing the supply of oxidant, determining whether the concentration of carbon monoxide increases and, if so, decreasing the supply of oxidant. Accordingly, the amount of oxidant may be increased and should the concentration of carbon monoxide increase as a consequence then the increase in the amount of oxidant may be reversed.

In one embodiment, the adjusting comprises decreasing the supply of oxidant, determining whether the concentration of carbon monoxide increases and, if so, increasing the supply of oxidant. Accordingly, the amount of oxidant may be decreased and if the amount of carbon monoxide increases as a consequence, then the decrease in the amount of oxidant may be reversed.

It will be appreciated that the approach set out above helps to identify a minima in the amount of carbon monoxide produced, such as will be experienced when processing an effluent stream with an excess of hydrogen.

In one embodiment, the adjusting comprises determining whether changing the fuel/oxidant ratio decreases the concentration of carbon monoxide towards a threshold amount and, if so, retaining that change. Accordingly, should a change to the amount of fuel to oxidant cause the amount of carbon monoxide produced move closer to a threshold amount of carbon monoxide than before the change was made, then that change may be kept.

In one embodiment, the adjusting comprises determining whether changing the fuel/oxidant ratio decreases the concentration of carbon monoxide below a threshold amount and, if so, reversing that change. Accordingly, should a change in the amount of fuel to oxidant cause the amount of carbon monoxide to drop below a threshold amount of carbon monoxide, then the change made to the amount of fuel to oxidant may be discarded.

In one embodiment, the adjusting comprises varying a supply of the fuel. Accordingly, the amount of fuel supplied to the abatement apparatus may be changed. This may allow the amount of oxidant supply to the abatement apparatus to remain constant.

In one embodiment, the adjusting comprises determining whether the concentration of carbon monoxide is above the threshold amount and, if so, decreasing the supply of the fuel. Accordingly, should it be determined that the amount of carbon monoxide is exceeds a threshold amount of carbon monoxide then the amount of fuel supplied may be reduced.

In one embodiment, the adjusting comprises determining whether the concentration of carbon monoxide is below the threshold amount and, if so, increasing the supply of the fuel. Accordingly, should it be determined that the amount of carbon monoxide fails to achieve a threshold amount of carbon monoxide then the amount of fuel supply to the abatement apparatus may be increased.

It will be appreciated that the above approach helps to identify an acceptable target amount of carbon monoxide produced, such as will be experienced when processing an effluent stream with an excess of nitrous oxide.

In one embodiment, the adjusting comprises varying a supply of the oxidant. Accordingly, the amount of oxidant supplied to the abatement apparatus may be changed. This may allow the amount of fuel supply to the abatement apparatus to remain constant.

In one embodiment, the adjusting comprises determining whether the concentration of carbon monoxide is above the threshold amount and, if so, decreasing the supply of the oxidant. Accordingly, should it be determined that the amount of carbon monoxide is exceeds a threshold amount of carbon monoxide then the amount of oxidant supplied may be reduced.

In one embodiment, the adjusting comprises determining whether the concentration of carbon monoxide is below the threshold amount and, if so, increasing the supply of the oxidant. Accordingly, should it be determined that the amount of carbon monoxide fails to achieve a threshold amount of carbon monoxide then the amount of oxidant supply to the abatement apparatus may be increased.

It will be appreciated that the above approach helps to identify an acceptable target amount of carbon monoxide produced, such as will be experienced when processing an effluent stream with an excess of TEOS.

According to a second aspect, there is provided an apparatus for adjusting operating conditions in an abatement apparatus configured to treat an effluent stream from a processing tool, the apparatus comprising: a sensor configured to determine a concentration of carbon monoxide produced by the abatement apparatus when treating the effluent stream; and a controller operable to adjust an operating parameter of the abatement apparatus in response to the concentration of carbon monoxide.

In one embodiment, the sensor is configured to measure the concentration of carbon monoxide present in an exhaust of the abatement apparatus.

In one embodiment, the sensor is an infrared spectrometer.

In one embodiment, the operating parameter comprises a fuel/oxidant ratio.

In one embodiment, the controller is operable to change the fuel/oxidant ratio to decrease the concentration of carbon monoxide.

In one embodiment, the controller is operable determine whether changing the fuel/oxidant ratio decreases the concentration of carbon monoxide and, if so, retaining that change.

In one embodiment, the controller is operable determine whether changing the fuel/oxidant ratio increases the concentration of carbon monoxide and, if so, to reverse that change.

In one embodiment, the controller is operable to vary a supply of the oxidant.

In one embodiment, the controller is operable increase the supply of oxidant, determine whether the concentration of carbon monoxide increases and, if so, to decrease the supply of oxidant.

In one embodiment, the controller is operable to decrease the supply of oxidant, determine whether the concentration of carbon monoxide increases and, if so, to increase the supply of oxidant.

In one embodiment, the controller is operable to determine whether changing the fuel/oxidant ratio decreases the concentration of carbon monoxide towards a threshold amount and, if so, to retain that change.

In one embodiment, the controller is operable to determine whether changing the fuel/oxidant ratio decreases the concentration of carbon monoxide below a threshold amount and, if so, to reverse that change.

In one embodiment, the controller is operable to vary a supply of the fuel.

In one embodiment, the controller is operable determine whether the concentration of carbon monoxide is above the threshold amount and, if so, to decrease the supply of the fuel.

In one embodiment, the controller is operable to determine whether the concentration of carbon monoxide is below the threshold amount and, if so, to increase the supply of the fuel.

In one embodiment, the controller is operable to vary a supply of the oxidant.

In one embodiment, the controller is operable to determine whether the concentration of carbon monoxide is above the threshold amount and, if so, to decrease the supply of the oxidant.

In one embodiment, the controller is operable to determine whether the concentration of carbon monoxide is below the threshold amount and, if so, to increase the supply of the oxidant.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

The Summary is provided to introduce a selection of concepts in a simplified form that are further described in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

Embodiments of the present invention will now be described further, with reference to the accompanying drawings, in which.

DETAILED DESCRIPTION

Figure 1:
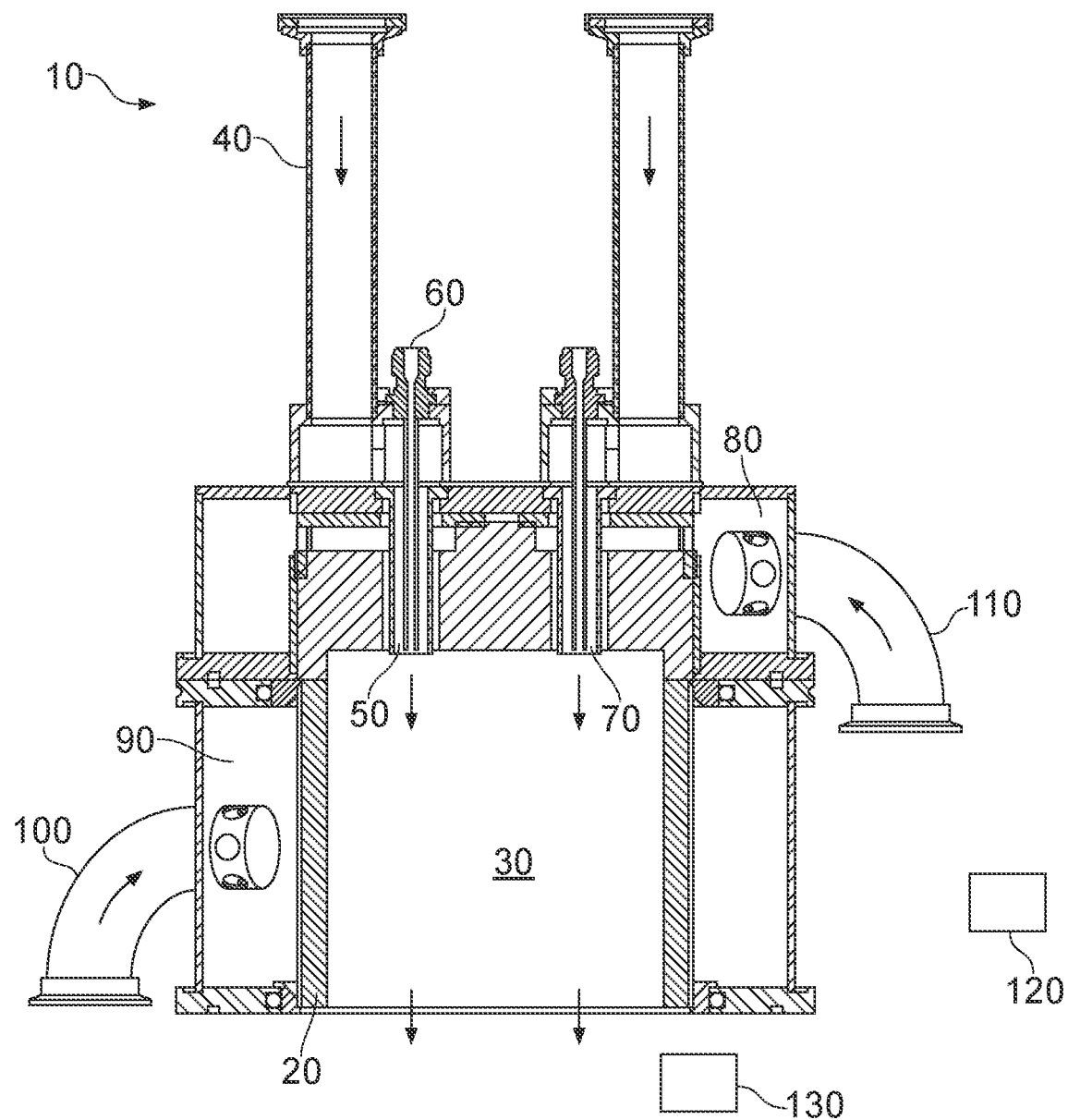
FIG. 1 illustrates an inwardly fired combustion abatement apparatus according to one embodiment.

Before discussing the embodiments in any more detail, first an overview will be provided. Embodiments provide a technique where the operating conditions within an abatement apparatus are controlled to provide for improved treatment of gases present in an effluent stream from a processing tool without causing adverse amounts of undesirable by-products being generated by measuring the amount of carbon monoxide generated by the abatement apparatus during the treatment of the effluent stream. This enables the performance of the abatement apparatus to be improved without requiring advanced knowledge of the compounds present in the effluent stream. In particular, the performance of an abatement apparatus for the controlled combustion of flammable gases such as hydrogen and hydrogen/ammonia mixtures or the destruction of oxidising gases such as nitrous oxide or TEOS is monitored using a gas sensor specific to the concentration carbon monoxide in the apparatus' exhaust. The response of the concentration of carbon monoxide to the addition of auxiliary oxidant (e.g. air or oxygen) or fuel (e.g. hydrogen, methane or propane) is used to derive optimum conditions for the removal of the gases being treated with the attendant minimisation of undesirable by-products (such as nitric oxide and nitrogen dioxide). This method does not require a priori knowledge of the amount of target gas to be destroyed but instead relies on adjusting the operating parameters of the abatement apparatus.

Existing combustion abatement apparatus are well-known for the destruction of a variety of gases used in the manufacture of semiconductor devices. The abatement of flammable gases such as hydrogen and hydrogen/ammonia mixtures require the provision of an oxygen source such as air for full combustion to occur. Likewise, an oxidant gas such as nitrous oxide requires the provision of a fuel such as methane to reduce (in this example) the nitrous oxide to nitrogen. In the case of nitrous oxide, incorrect addition of fuel gas can lead to unwanted production of nitric oxide and nitrogen dioxide (collectively known as NOx). The permitted level of unabated target gas in the exhaust may be limited to an absolute concentration in the exhaust (i.e. to be below its flammable limit), an emission rate (in mass per unit time) or a relative destruction rate efficiency (DRE). By-product emissions may also be required to be below a certain level. It is the intent of an abatement device to meet or exceed these limits while using the minimum amount of resources.

In some cases it is possible to communicate via digital or analogue means to the abatement device the concentration of gas to be abated. In this way the operation of the abatement can be optimised in terms of resources used. In other circumstances it may not be possible to do this because of expense, site infrastructure or other commercial reasons. Embodiments seek to monitor performance and adjust operating parameters in isolation.

Abatement Apparatus

FIG. 1 shows an inwardly fired combustion abatement apparatus 10 according to one embodiment. The abatement apparatus 10 comprises an inwardly fired foraminous burner 20 which is supplied with a hydrocarbon fuel (typically methane or propane)/air mixture that provides a hot zone and ignition source for chemical destruction of target compounds within an effluent stream which is introduced into a combustion chamber 30 at the core of the burner by means of inlet pipework 40 ending at a nozzle 50. Typically, fuel is supplied to a plenum 90 from a fuel inlet 100 to supply the foraminous burner 20 under the control of a controller 120.

The nozzles 50 are provided with ancillary ports located as a central lance 60 or coaxial annulus 70 (supplied from a shared plenum 80) which are used for the introduction of fuel gases or oxidants supplied under the control of the controller 120 in order to aid the destruction of these compounds to be treated. Typically, a fuel/oxidant mixture is supplied via the central lance 60 and a fuel/oxidant inlet 110 to the plenum 90 to supply the coaxial annulus 70 under the control of the controller 120.

An infrared spectrometer 130 is provided which measures the concentration of CO in the exhaust from the combustion chamber 30.

A water weir and quench section (not shown) is provided downstream from the combustion chamber 30 for the cooling of the exhaust, as well as a packed tower (not shown) for the absorption of water-soluble gases.

Abatement—Hydrogen or Hydrogen/Ammonia Mixtures

The abatement of inflammable gases such as hydrogen or hydrogen/ammonia mixtures can be facilitated by adding air around the nozzle 50 so as to provide enough oxygen for the complete combustion of these materials. In the event of insufficient air, the combustion chamber 30 becomes starved of oxygen and the exhaust of the abatement apparatus 10 contains products of incomplete combustion of the fuel. In the event of an excess of air, the foraminous burner 20 is cooled to a point when combustion of the fuel is quenched and again the products of incomplete combustion of the fuel are seen in the exhaust. The extreme cases of under- or over-supply of air, unburnt hydrogen is detected in the exhaust. For ammonia, unburned gas will mostly be dissolved in the water-washed packed tower downstream of the burner assembly although some will also escape into the exhaust.

Figure 2:
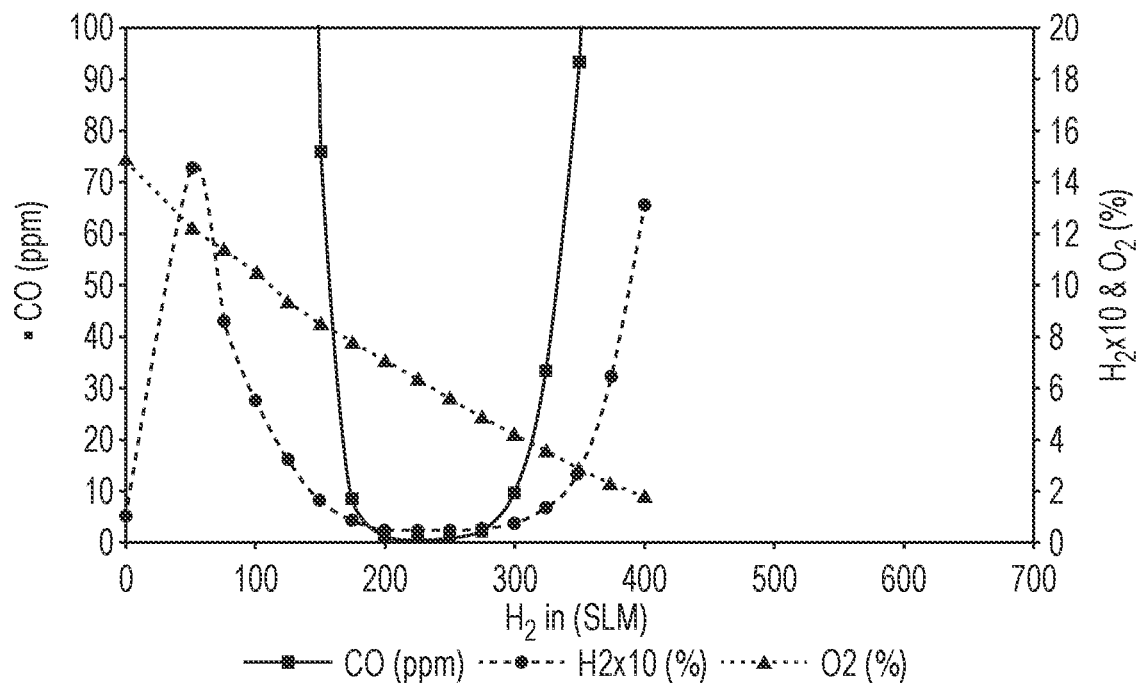
FIG. 2 is a graph showing CO, $H_2$ (multiplied by 10 to fit the same scale as $O_2$) and $O_2$ content of the exhaust vs. $H_2$ flow in 200 slm of $N_2$ with 500 of air via the coaxial concentric air inlets and 40 slm of air via each central lance addition port.

An example of this is shown in FIG. 2 where 500 slm of air was supplied around the nozzles 70 while the flow of hydrogen (diluted with 200 slm of nitrogen) was increased up to 400 slm. An additional 40 slm of compressed dried air was supplied to the lance 60 located in the centre of each nozzle 70. The concentration of carbon monoxide (CO), hydrogen and oxygen in the exhaust stream are shown. The concentration of oxygen falls monotonously with hydrogen added but the concentration of CO exhibits a U-shaped curve with the lowest levels of CO corresponding to the region of air flow where the hydrogen is destroyed completely. The concentration of hydrogen and oxygen were measured by electrochemical cells whereas the concentration of CO was measured by infrared spectrometry using the infrared spectrometer 130. Electrochemical cells are prone to contamination, cross sensitivity and deterioration whereas infrared spectrometry can be made very selective and protected against contamination or deterioration. Although CO can be measured by pellistor sensors, these are cross sensitive to the presence of other flammable gases and not reliably in environments where there is limited availability of oxygen. Infrared sensors also have rapid response times and not prone to saturation problems.

Figure 3:
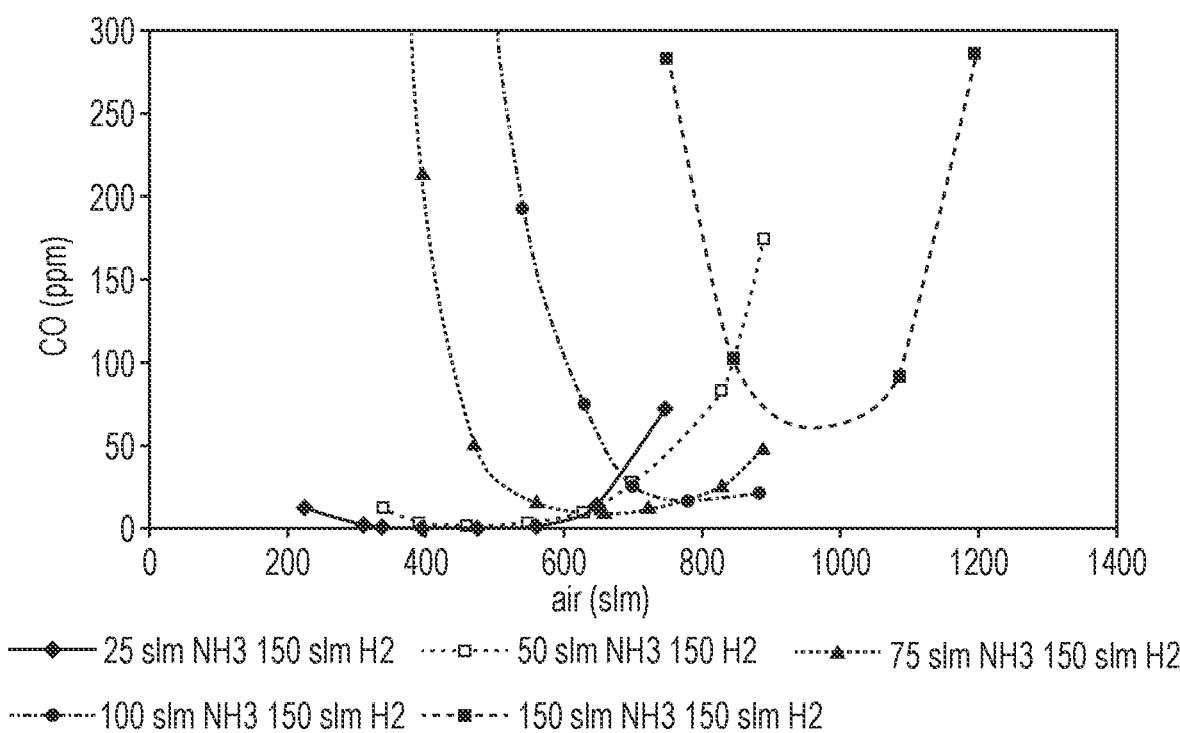
FIG. 3 is a graph showing CO in the exhaust for different amounts of air via coaxial concentric air inlets and the central lance addition ports for mixtures of $NH_3$ and $H_2$.

The same trend is shown in FIG. 3 where the concentration of CO in the exhaust is plotted relative to the amount of air added around the inlet nozzles for different mixtures of hydrogen and increasing amounts of ammonia in 200 slm of nitrogen. Again, the CO emissions follow a U-shaped profile with the minima coinciding with the optimum abatement performance.

Figure 4:
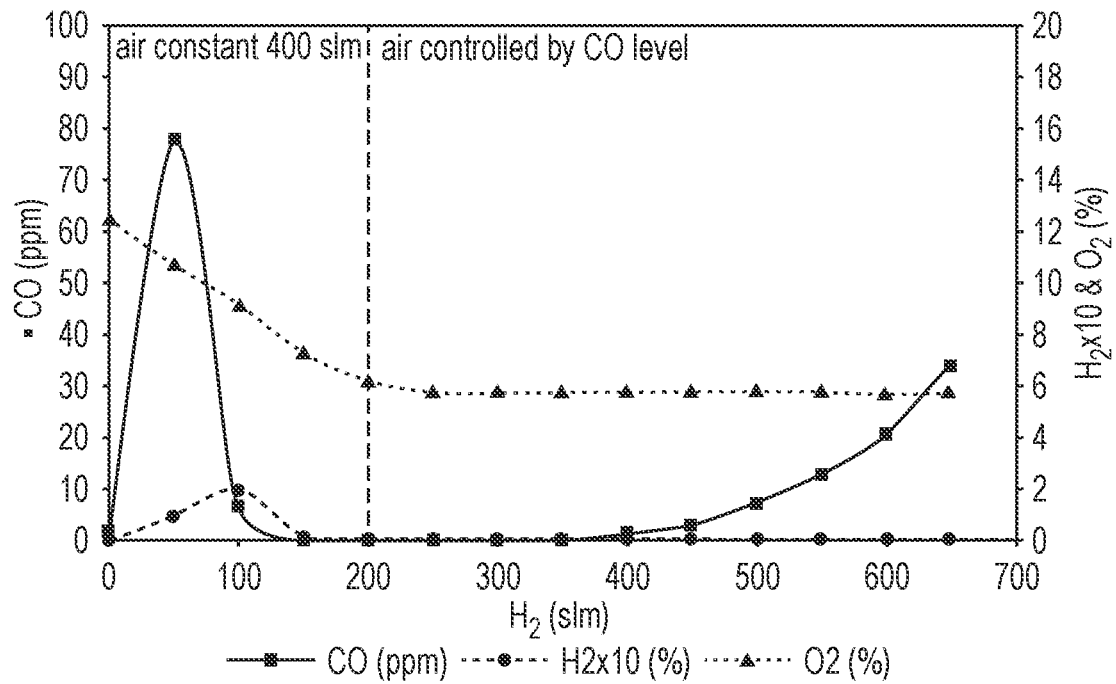
FIG. 4 is a graph showing CO, $H_2$ (multiplied by 10 to fit the same scale as $O_2$) and $O_2$ content of the exhaust vs. $H_2$ flow in 200 slm of $N_2$ with air addition via the coaxial concentric air inlets controlled to minimise CO in the exhaust.

FIG. 4 shows the emissions for increasing amounts of hydrogen added whereby the amount of air added is controlled to minimise CO concentration in the exhaust by means of a feedback loop between the infrared spectrometer 130 and an air flow controller controlling the amount of air supplied to the combustion chamber 30 under the control of the controller 120. Note that below 200 slm of hydrogen the amount of air was uncontrolled at a base level of 400 slm. Minimising CO has the auxiliary effect of maintaining a constant level of oxygen in the exhaust. For the reasons disclosed above, it is much easier to monitor CO than $O_2$.

Figure 5:
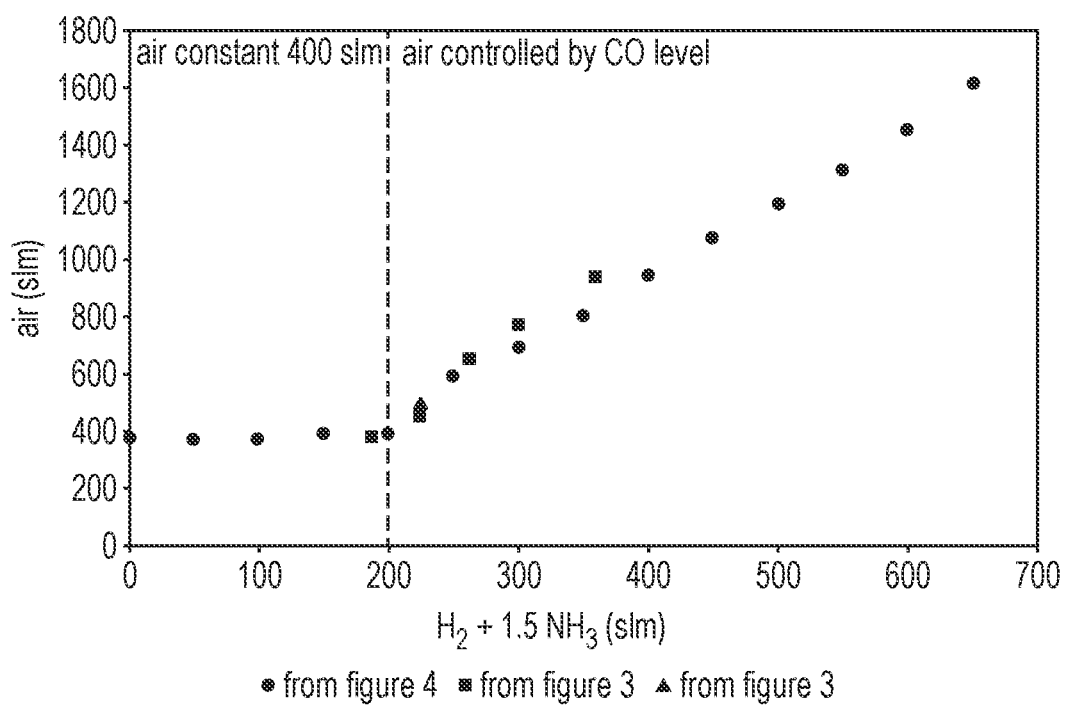
FIG. 5 is a graph showing the air flow required to minimise CO in exhaust for different operating conditions.

FIG. 5 shows the air flow added for different amounts of hydrogen or hydrogen and ammonia (for the purposes of accounting for oxygen required for combustion one molecule of ammonia is treated as 1½ molecules of hydrogen) for FIGS. 3-5. Above the lower limit of 400 slm of air the points lie on a similar trend of air added to minimise CO emissions and demonstrate that this is a viable means of feedback control for the optimum destruction of these gas mixtures.

Abatement Optimisation—Hydrogen or Hydrogen/Ammonia Mixtures

Figure 6:
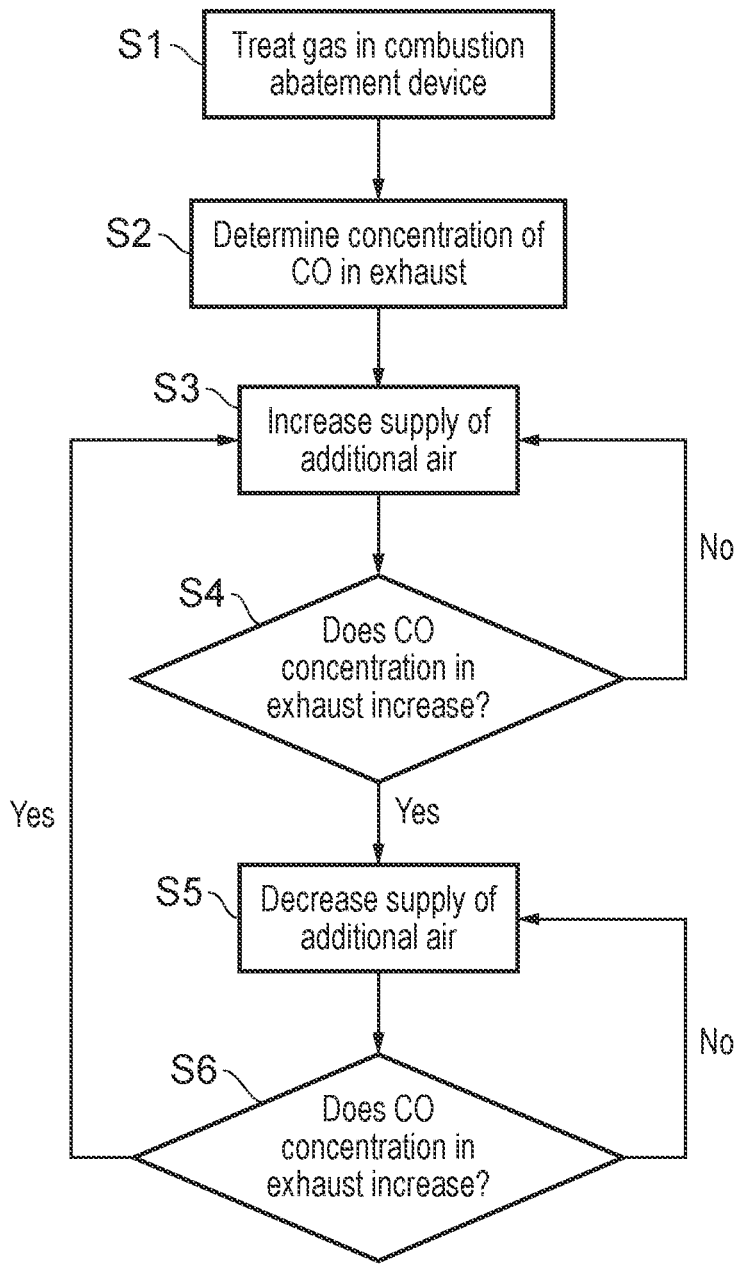
FIG. 6 is a schematic flow chart for optimised air flow control for the abatement of $H_2$/$NH_3$ mixtures by monitoring of CO emissions.

FIG. 6 is a schematic flow chart outlining the main steps performed by the controller 120 when optimising operating conditions within the combustion chamber 30 to treat effluent streams containing hydrogen or hydrogen/ammonia mixtures.

At step S1, the effluent stream is treated within the combustion chamber 30, with the controller 30 providing default or preset amounts of fuel and oxidant (in this example air). Processing proceeds to step S2.

At step S2, the amount of CO in the exhaust is determined by the infrared spectrometer 130. Processing proceeds to step S3.

At step S3, the controller 130 increases the ratio of oxidant to fuel/$H_2$/$NH_3$. In this example, this is done by increasing the amount of air supplied to the combustion chamber 30. Processing proceeds to step S4.

At step S4, the controller 130 determines whether the amount of CO in the exhaust measured by the infrared spectrometer 130 increases or not. If the amount of CO decreases, then processing returns to step S3. If the amount of CO increases, then processing proceeds to step S5.

At step S5, the controller 130 decreases the ratio of oxidant to fuel/$H_2$/$NH_3$. In this example, this is done by decreasing the amount of air supplied to the combustion chamber 30. Processing proceeds to step S6.

At step S6, the controller 130 determines whether the amount of CO in the exhaust measured by the infrared spectrometer 130 decreases or not. If the amount of CO decreases, then processing returns to step S3. If the amount of CO increases, then processing proceeds to step S5.

As mentioned above and as can be seen from FIG. 3, through this approach the operating conditions of the combustion chamber 30 can be adjusted to follow the curves illustrated to minimise the amount of CO present in the exhaust, which optimises the abatement of $H_2$/$NH_3$ mixtures and reduces the amount of $H_2$ present in the exhaust. It will be appreciated that in other embodiments, an adaptive algorithm may be used.

Abatement—Nitrous Oxide

Figure 7:
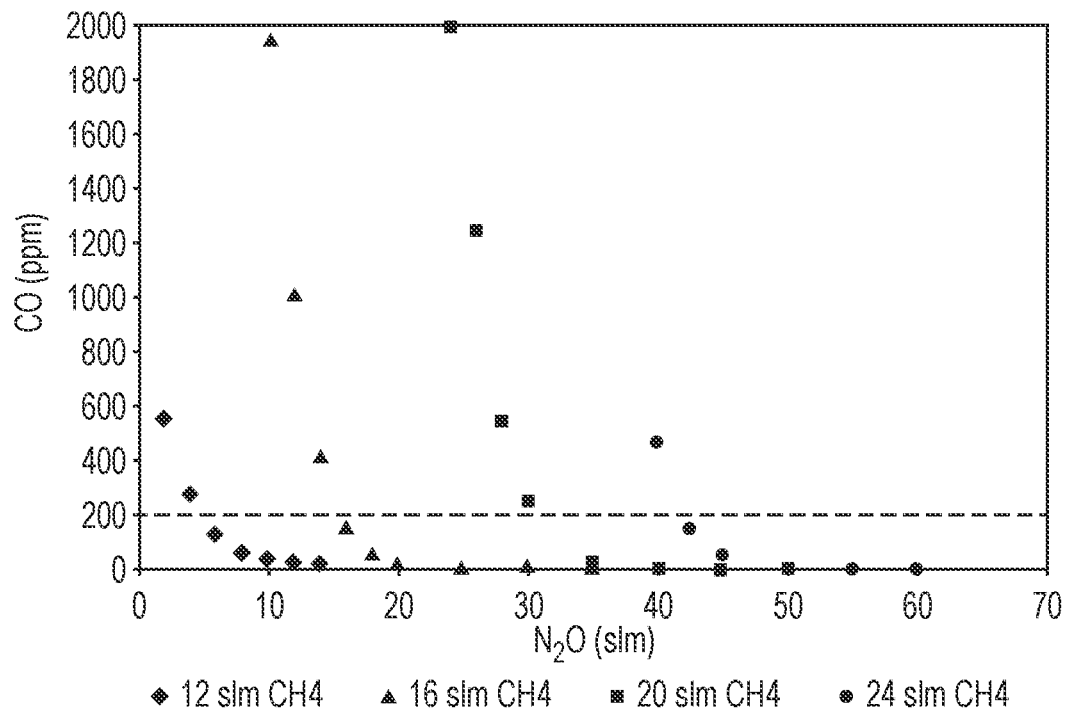
FIG. 7 is a graph showing the CO in the exhaust vs $N_2O$ (diluted with 200 slm of $N_2$) in effluent stream inlets for different amounts of $CH_4$ added via the central lance addition ports.

Another embodiment of this approach is demonstrated in FIG. 7 for the destruction of nitrous oxide ($N_2O$) diluted with 200 slm of nitrogen. $N_2O$ can be reduced to nitrogen by reaction with a fuel such as methane ($CH_4$) which is added to the inlet flow via the lance 60 in the centre of the nozzle 50. Undesirable side reactions can also produce oxides of nitrogen (nitric oxide (NO) and nitrogen dioxide ($NO_2$) grouped together under the umbrella term "NOx") as a by-product. The graph shows the decrease in CO at different amounts of $CH_4$ added to the lance 60. Excess $CH_4$ relative to $N_2O$ again results in its incomplete oxidation and yields CO. A dashed line is drawn across the graph at a desired level of 200 ppm of CO in the exhaust. By employing the infrared spectrometer 120 in the exhaust with a feedback loop using the controller 120 to control a methane flow controller (not shown) it is possible to select a level of CO to be present in the exhaust so as to optimise the formation of NOx and maximise the destruction of $N_2O$.

Figure 8:
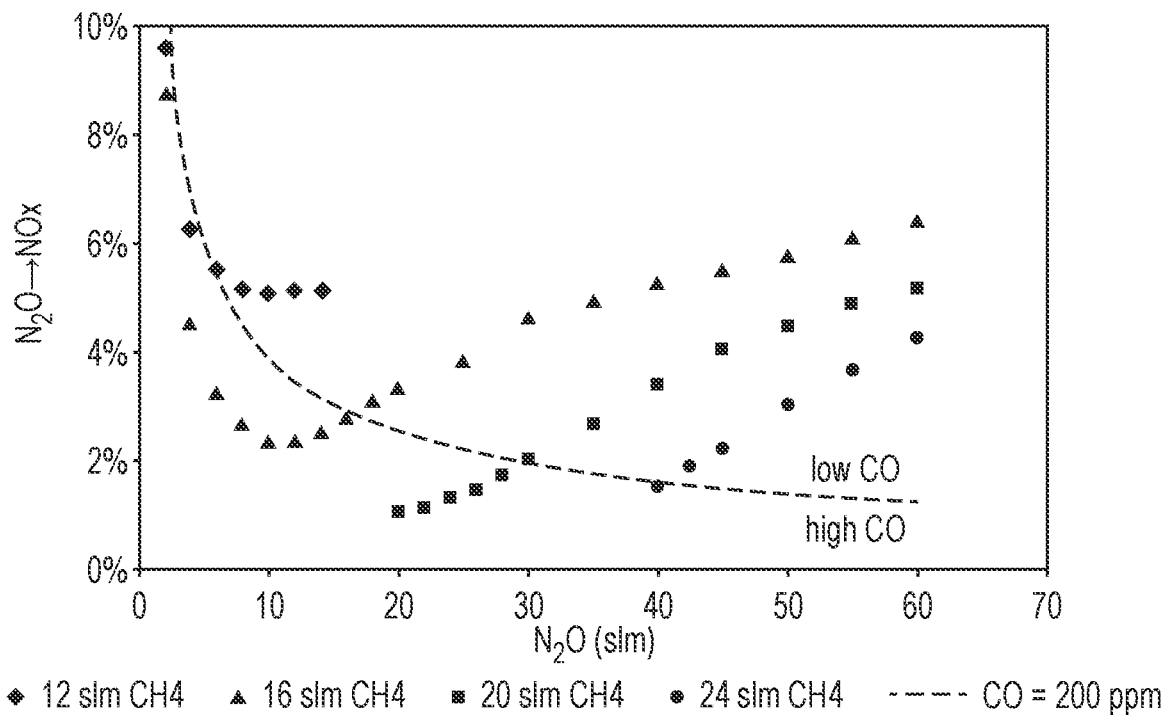
FIG. 8 is a graph showing the percentage conversion of $N_2O$ converted to NOx (NO+$NO_2$) for the conditions shown in FIG. 6—the dashed line indicates the region where the CO in the exhaust is 200 ppm.

The yield of NOx resulting from the destruction of $N_2O$ for different amounts of added $CH_4$ is shown in FIG. 8 The yield of this unwanted by-product varies with $N_2O$ flow and inject flow and the dashed line on the graph indicates the NOx yield when the CO concentration in the exhaust is 200 ppm.

Figure 9:
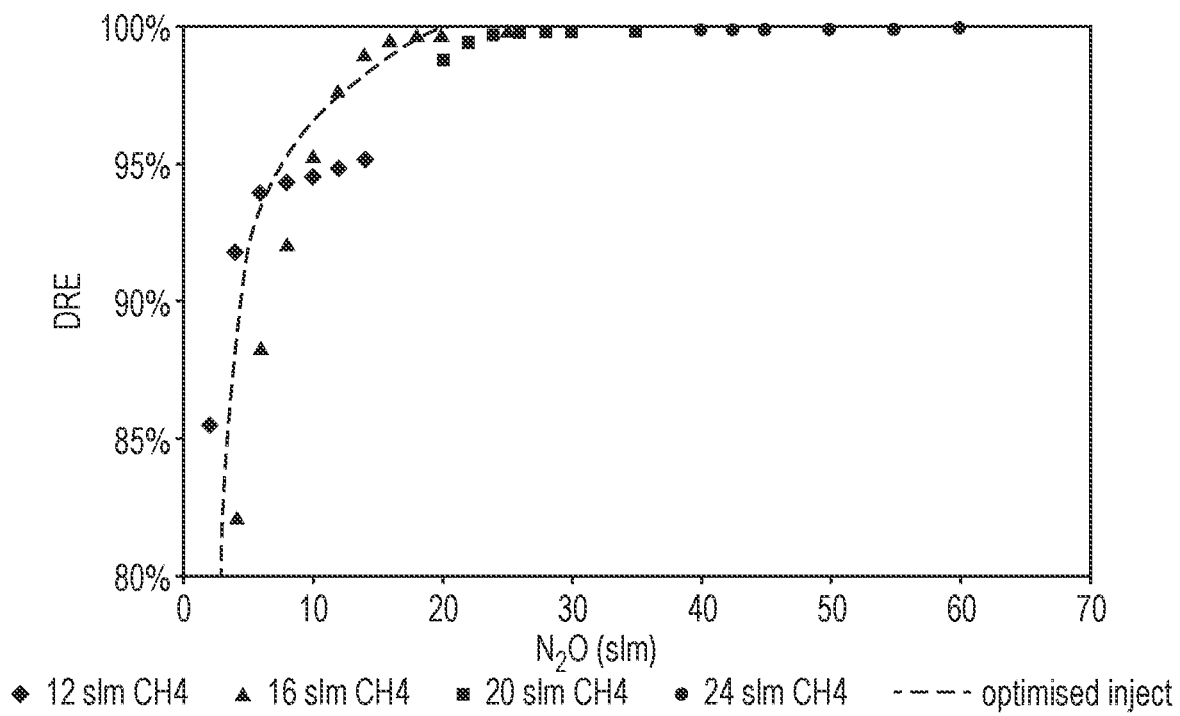
FIG. 9 is a graph showing the destruction rate efficiency (DRE) of $N_2O$ for the conditions shown in FIG. 6—the dashed line indicates region where the CO in the exhaust is 200 ppm.

FIG. 9 shows the destruction rate efficiency (DRE) for $N_2O$ for different amounts of added fuel. The dashed line shows the DRE resulting from adding enough $CH_4$ to achieve 200 ppm of CO in the exhaust. Thus conditions can be found which are a good compromise between effective destruction of $N_2O$ and NOx production. Other target concentrations of CO in the exhaust may be selected depending on the relative importance of these parameters (e.g low NOx vs low CO).

Figure 10:
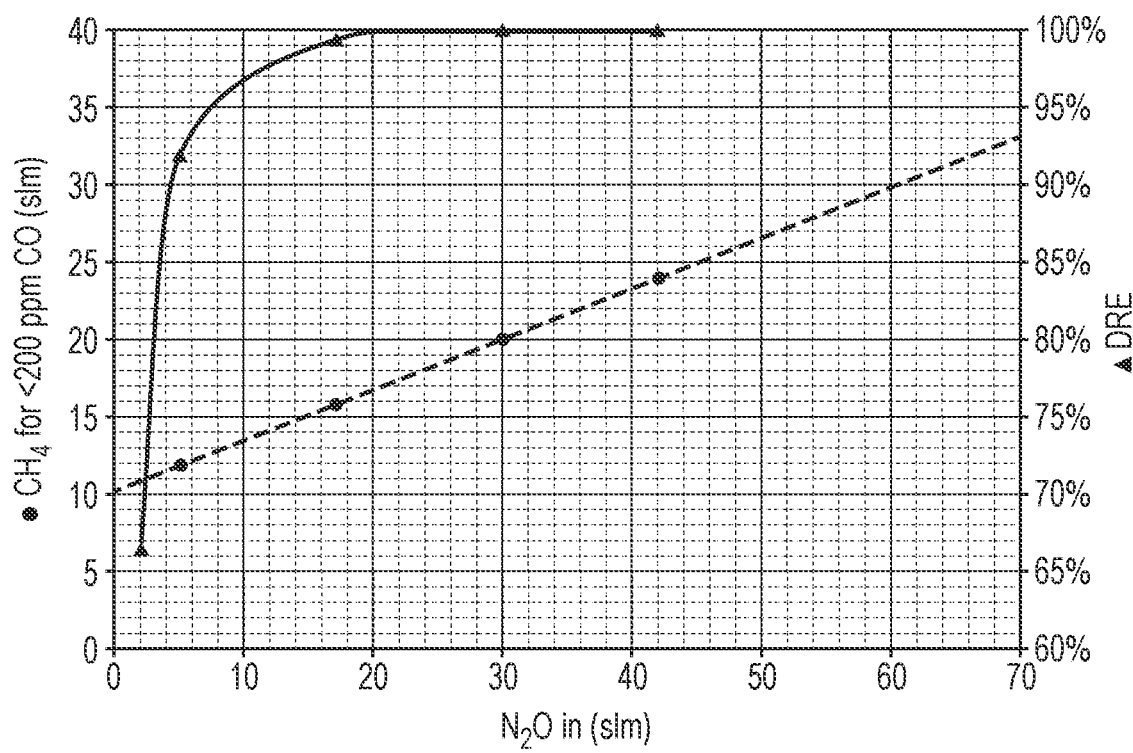
FIG. 10 is a graph showing the amount of $CH_4$ required to achieve 200 ppm of CO in the exhaust and the corresponding DRE of $N_2O$ vs amount of $N_2O$ supplied.

FIG. 10 shows the variation in added $CH_4$ required to achieve 200 ppm of CO in the exhaust and also the DRE of $N_2O$. Like the previous embodiment this demonstrates the viability of using a CO sensor for feedback control of added reagent gases in order to optimise abatement.

Abatement Optimisation—Nitrous Oxide

Figure 11:
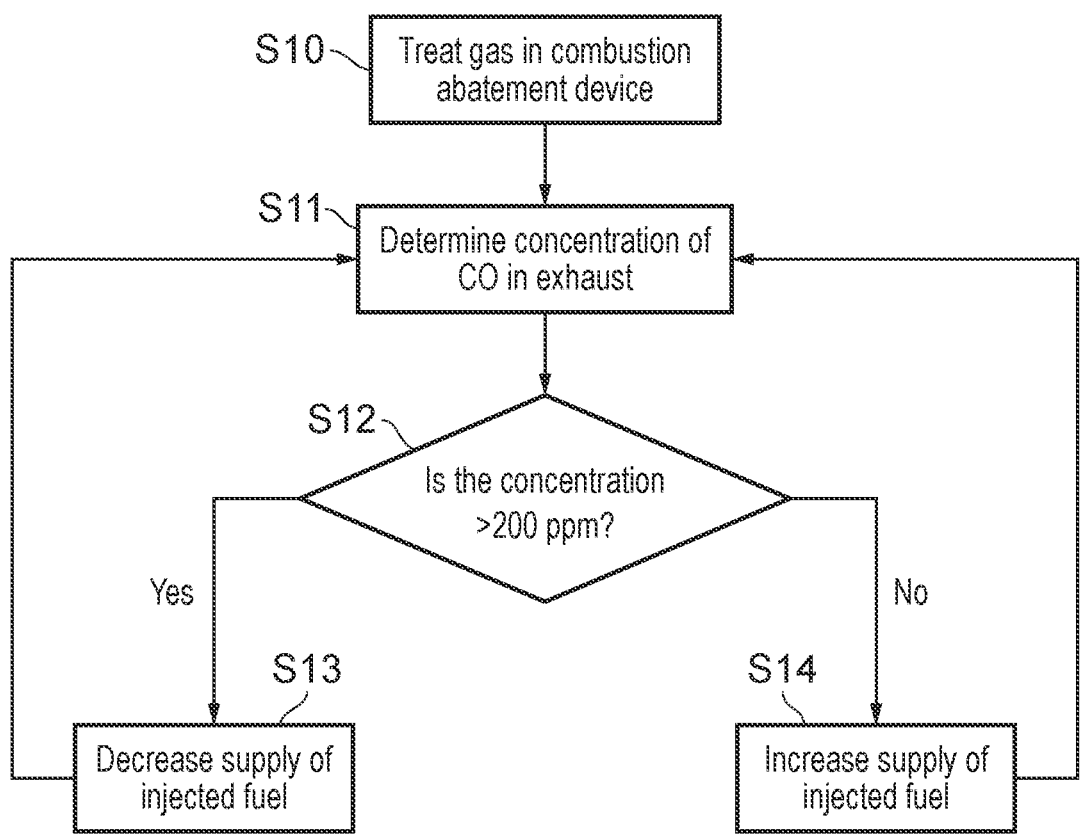
FIG. 11 is a schematic flow chart for optimised fuel inject control for the abatement of $N_2O$ by monitoring of CO emissions.

FIG. 11 is a schematic flow chart outlining the main steps performed by the controller 120 when optimising operating conditions within the combustion chamber 30 to treat effluent streams containing nitrous oxide mixtures.

At step S10, the effluent stream is treated within the combustion chamber 30, with the controller 30 providing default or preset amounts of fuel and oxidant (in this example air). Processing proceeds to step S11.

At step S11, the amount of CO in the exhaust is determined by the infrared spectrometer 130. Processing proceeds to step S12.

At step S12, the controller 120 determines whether the amount of CO in the exhaust measured by the infrared spectrometer 130 exceeds a threshold. In this example, the threshold is 200 ppm, but it will be appreciated that other thresholds may be used. If the amount of CO in the exhaust is higher than the threshold, the processing proceeds to step S13. If the amount of CO in the exhaust is not higher than the threshold, the processing proceeds to step S14.

At step S13, the controller 120 decreases the ratio of fuel to oxidant, in this example $N_2O$. In this example, this is done by decreasing the amount of fuel supplied to the combustion chamber 30. Processing returns to step S12.

At step S14, the controller 120 increases the ratio of fuel to oxidant, in this example $N_2O$. In this example, this is done by increasing the amount of fuel supplied to the combustion chamber 30. Processing returns to step S12.

As mentioned above and as can be seen from FIG. 7, through this approach the operating conditions of the combustion chamber 30 can be adjusted to follow the curves illustrated to reduce the amount of CO present in the exhaust to below the threshold amount, which optimises the abatement of $N_2O$ mixtures. It will be appreciated that in other embodiments, an adaptive algorithm may be used.

Abatement—TEOS

One embodiment provides a method to optimise tetraethyl orthosilicate abatement using an exhaust gas sensor. A leading indicator of incomplete abatement of TEOS is the formation of carbon monoxide. The concentration of CO in the exhaust is monitored using a suitable sensor (e.g. by infra-red spectrometry using the infrared spectrometer 130) and the oxygen added adjusted accordingly to achieve a desired amount.

Many semiconductor fabricators extract oxygen from the air using a pressure swing adsorber and the resulting purity is typically 90-95%. Ideally this could be monitored and used to adjust the inject flow accordingly. This is difficult to do accurately and in a timely fashion; thus, the strategy of adjusting the inject flow to achieve a limiting value of CO in the exhaust accommodates oxygen of unknown purity.

Tetraethyl orthosilicate, formally named tetraethoxysilane and abbreviated TEOS, is the chemical compound with the formula $Si(OC_2H_5)_4$. TEOS is a colourless volatile liquid that degrades in water. TEOS is the ethyl ester of orthosilicic acid, Si(OH)$_4$. It is the most prevalent alkoxide of silicon widely used in semiconductor manufacture for the deposition of silicon dioxide coatings on wafer.

Whilst TEOS is of low toxicity compared to the methyl-ester analogue Si(OCH$_3$)$_4$ its release to the environment is undesirable. TEOS is readily hydrolysed by water to hydrated silica and ethanol but this tends to produce a foam and therefore wet scrubbing of TEOS is not recommended.

TEOS is flammable according to the equation:

$$Si(C_2H_5O)_4 + 12O_2 = SiO_2 + 8CO_2 + 10H_2O$$

In practice TEOS is difficult to ignite and requires an ignition source such as a flame and is typically mixed with oxygen before combustion. Insufficient oxygen will cause incomplete combustion and lead to foaming in the drain tank of the combustor. Excess oxygen is wasteful of resources. Often the purity of oxygen supplied to the abatement apparatus is of unknown purity, so it is not enough to have foreknowledge of the incoming TEOS flow to set an appropriate oxygen flow. Embodiments provide a method of deducing the optimum oxygen addition rate.

Figure 12:
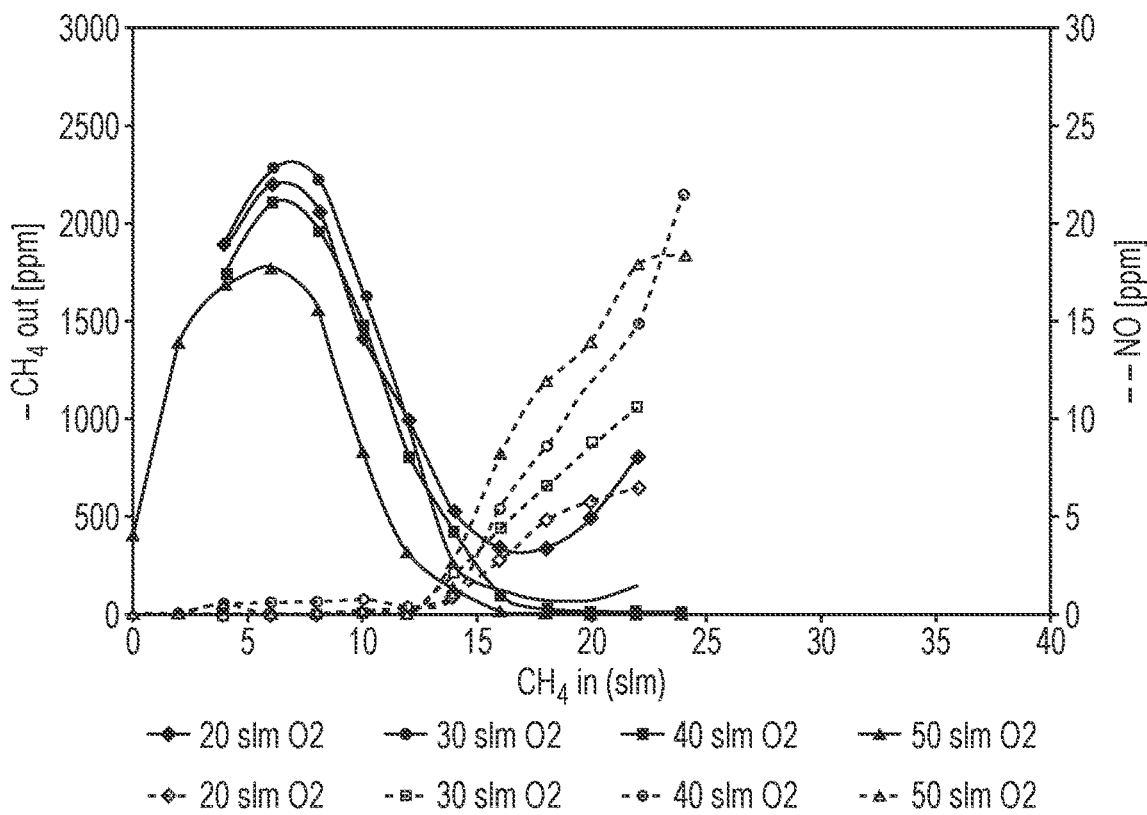
FIG. 12 is a graph showing methane and nitric oxide emissions as a function of concentric methane flow and oxygen injects for a nitrogen loading on the nozzle of 300 slm.
Figure 13:
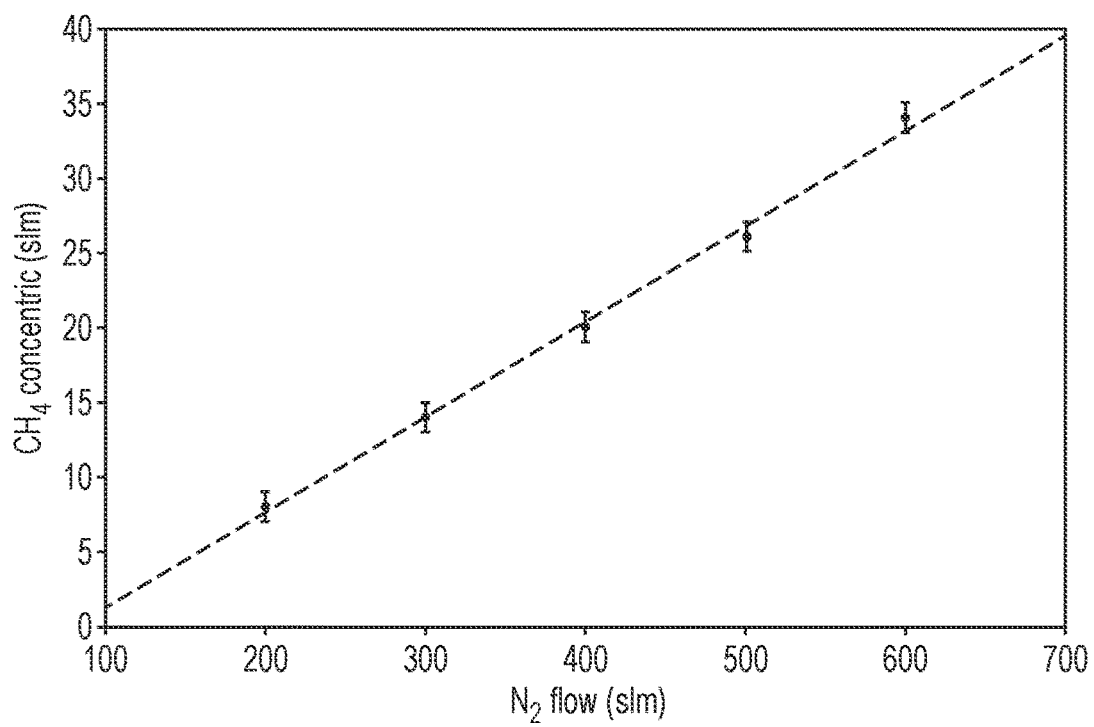
FIG. 13 is a graph showing minimum $CH_4$ inject flows vs. nitrogen load.
Figure 14:
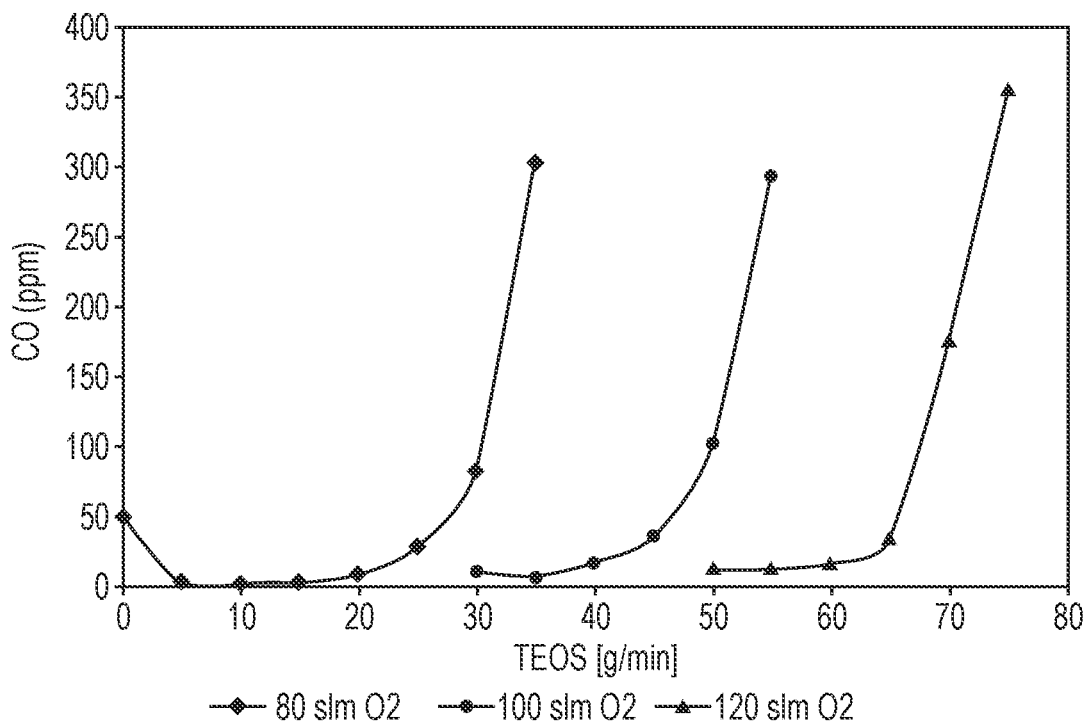
FIG. 14 is a graph showing carbon monoxide and carbon dioxide concentration in exhaust as a function of TEOS flow for 600 slm $N_2$, 34 slm $CH_4$ and 80-120 slm $O_2$.
Figure 15:
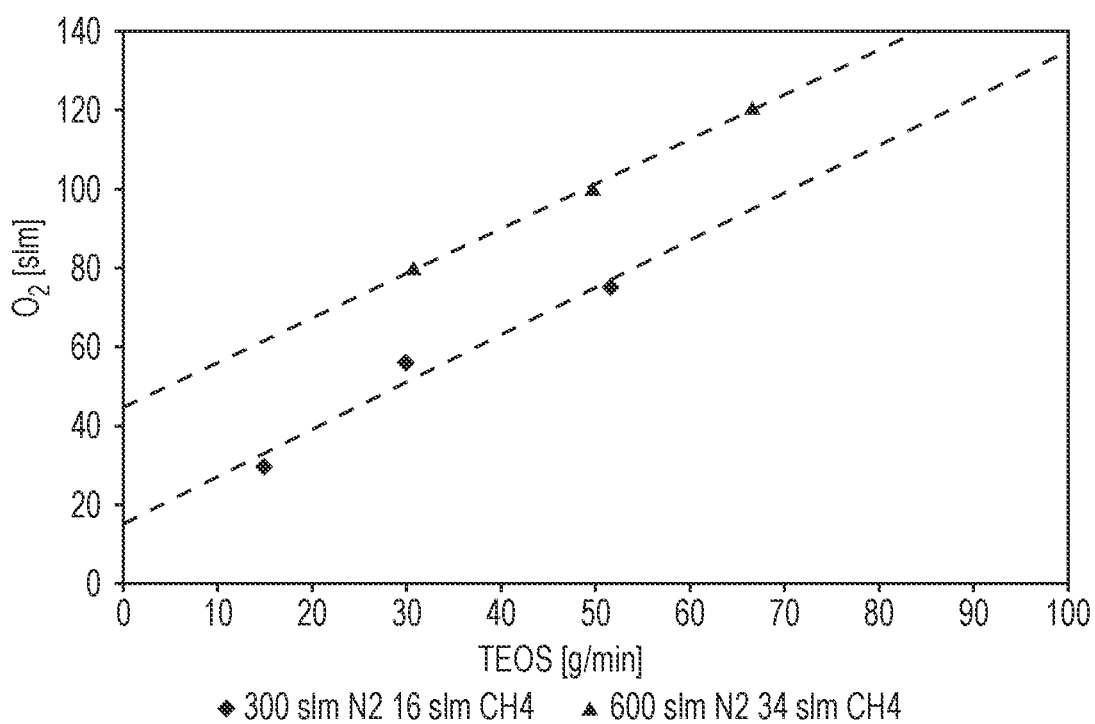
FIG. 15 is a graph showing limiting oxygen inject required to produce 100 ppm of CO in the exhaust from TEOS at 200 and 300 slm of $N_2$ to the nozzle.

FIG. 12 is a plot of methane (CH$_4$) and NOx emissions as a function concentric methane fuel surrounding the nozzle 50. No TEOS is used at this stage and the point at which NOx appears in the exhaust is used to establish the minimum methane surrounding the nozzle 50 enough to establish a stable flame under these conditions. This is a function of nozzle nitrogen loading as shown in FIG. 13. A linear relationship is implied with a negative intercept, although it is likely that the fuel required plateaus at a low level. By this means it is possible to establish a concentric methane flow to suit the operating parameters Having established the methane required to stabilise a flame around the nozzle 50 it is possible to consider the amount of oxygen required to abate TEOS. Taking the data presented in FIG. 14 (for 600 slm N$_2$ and increasing TEOS) an arbitrary (target threshold) level of CO in the exhaust of 100 ppm can be used to define a limiting capacity for abatement at three different amounts of O$_2$. These limits for different nozzle nitrogen loadings are shown in FIG. 15

Although there are only 3 points per flow rate both the 300 slm and 600 slm results appear to lie on a straight line—the slopes in each case being 1.19 and 1.11 litres O$_2$ per gram of TEOS. The stoichiometric formula for the complete combustion of TEOS is as given earlier. Therefore 1 mol of TEOs requires 12 mol of O$_2$. Since the molecular weight of TEOS is 208.33 g/mol then 1 g of TEOs requires 12×22.4/208.33 litres of oxygen. This is 1.29 litres per gram of TEOS—close to the slopes of the lines in FIG. 15.

Thus it is possible to define a set of parameters for the abatement of TEOS in nitrogen:

CH$_4$(concentric in slm)=0.064 nozzle N$_2$ in slm−5.2

O$_2$(lance in slm)=1.15 TEOS in g/min+(nozzle N$_2$ in slm)/10−15

In practice, although the nitrogen flow is known and stable, the TEOS flow is often not known and furthermore the oxygen available to the abatement apparatus of less than 100% purity. In order to overcome this, a carbon monoxide sensor (such as the infrared spectrometer 130) is used to derive the appropriate level of oxygen flow by simply adjusting its set point until the CO in the exhaust reaches a desired threshold amount.

Abatement Optimisation—TEOS

Figure 16:
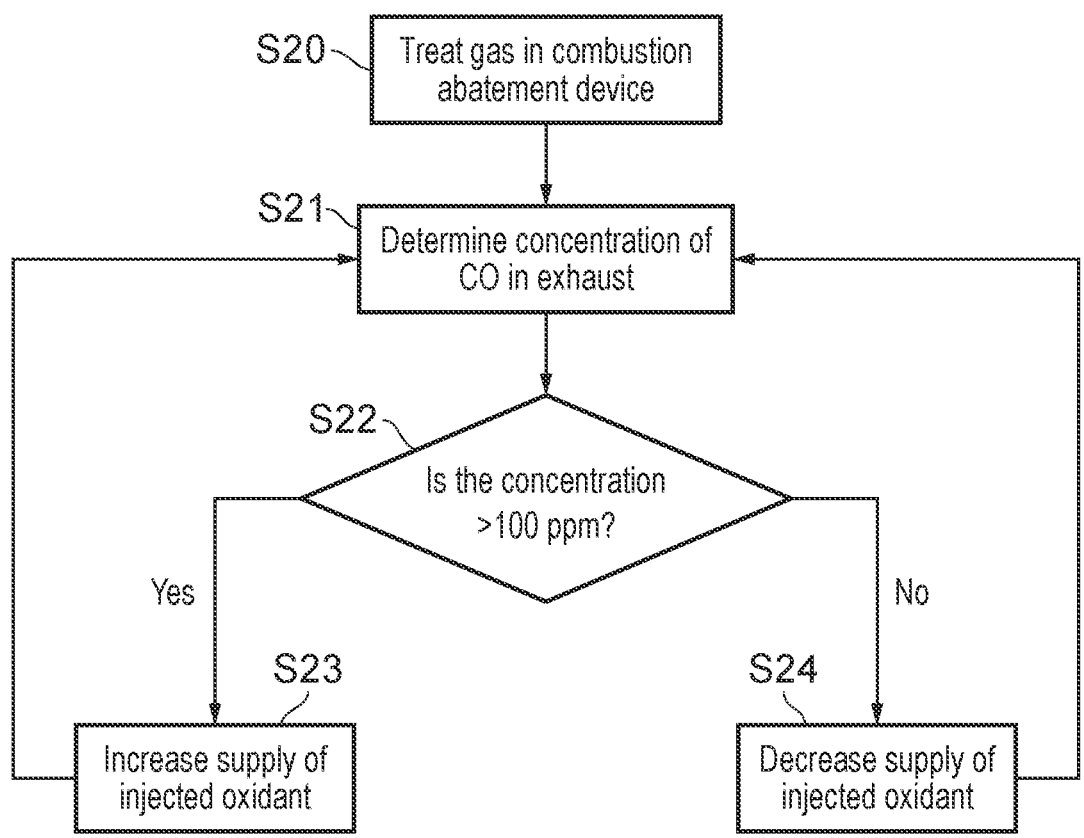
FIG. 16 is a schematic flow chart for optimised fuel inject control for the abatement of TEOS by monitoring of CO emissions.

FIG. 16 is a schematic flow chart outlining the main steps performed by the controller 120 when optimising operating conditions within the combustion chamber 30 to treat effluent streams containing TEOS mixtures.

At step S20, the effluent stream is treated within the combustion chamber 30, with the controller 30 providing default or preset amounts of fuel and oxidant (in this example oxygen). Processing proceeds to step S21.

At step S21, the amount of CO in the exhaust is determined by the infrared spectrometer 130. Processing proceeds to step S22.

At step S22, the controller 120 determines whether the amount of CO in the exhaust measured by the infrared spectrometer 130 exceeds a threshold. In this example, the threshold is 100 ppm, but it will be appreciated that other thresholds may be used. If the amount of CO in the exhaust is higher than the threshold, the processing proceeds to step S23. If the amount of CO in the exhaust is not higher than the threshold, the processing proceeds to step S24.

At step S23, the controller 120 increases the ratio of oxidant to fuel. In this example, this is done by increasing the amount of oxygen or supplied to the combustion chamber 30. Processing returns to step S22.

At step S24, the controller 130 decreases the ratio of oxidant to fuel. In this example, this is done by decreasing the amount of oxygen supplied to the combustion chamber 30. Processing returns to step S22.

As mentioned above and as can be seen from FIG. 14, through this approach the operating conditions of the combustion chamber 30 can be adjusted to follow the curves illustrated to reduce the amount of CO present in the exhaust to below the threshold amount, which optimises the abatement of TEOS mixtures. It will be appreciated that in other embodiments, an adaptive algorithm may be used.

Hence, it can be seen that embodiments use a sensor specific to CO for the control of oxidant added or fuel added, CO being a byproduct of incomplete combustion. In the case of N$_2$O abatement embodiments use the CO level to strike a compromise between DRE and NOx yield.

Although illustrative embodiments of the invention have been disclosed in detail herein, with reference to the accompanying drawings, it is understood that the invention is not limited to the precise embodiment and that various changes and modifications can be effected therein by one skilled in the art without departing from the scope of the invention as defined by the appended claims and their equivalents.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. A method of optimising operating conditions in an abatement apparatus configured to treat an effluent stream from a semiconductor processing tool, said method comprising:
   measuring a concentration of carbon monoxide produced by said abatement apparatus when treating said effluent stream; and
   adjusting an operating parameter of said abatement apparatus in response to said concentration of carbon monoxide, wherein adjusting the operating parameter comprises:

repeating steps of:
  modifying a supply of oxidant, and
  measuring the concentration of carbon monoxide in an exhaust of the abatement apparatus,
to arrive at a supply of oxidant at which an increase in the supply of oxidant causes an increase in the concentration of carbon monoxide and a decrease in the supply of oxidant causes an increase in the concentration of carbon monoxide.

2. The method of claim 1, wherein measuring the concentration of carbon monoxide comprises measuring the concentration of carbon monoxide with an infrared spectrometer.

3. The method of claim 1, wherein modifying the supply of oxidant alters a fuel/oxidant ratio.

4. An apparatus for optimising/adjusting operating conditions in an abatement apparatus configured to treat an effluent stream from a semiconductor processing tool, said apparatus comprising:

a sensor configured to determine a concentration of carbon monoxide produced by said abatement apparatus when treating said effluent stream; and a controller operable to adjust an operating parameter of said abatement apparatus in response to said concentration of carbon monoxide through steps comprising:

repeating steps of:

modifying a supply of oxidant, and measuring the concentration of carbon monoxide using the sensor, to arrive at a supply of oxidant at which an increase in the supply of oxidant causes an increase in the concentration of carbon monoxide and a decrease in the supply of oxidant causes an increase in the concentration of carbon monoxide.

* * * * *